US011876483B2

(12) United States Patent
Wilhelm et al.

(10) Patent No.: US 11,876,483 B2
(45) Date of Patent: Jan. 16, 2024

(54) METHOD FOR COMMUNICATION BETWEEN TRANSCEIVERS OF MODULE LEVEL DEVICES WITHIN A PHOTOVALTAIC MODULE LEVEL MONITORING SYSTEM

(71) Applicant: Fronius International GmbH, Pettenbach (AT)

(72) Inventors: Johann Wilhelm, Wels (AT); Christian Fasthuber, Wels (AT)

(73) Assignee: Fronius International GmbH, Pettenbach (AT)

( * ) Notice: Subject to any disclaimer, the term of this patent is extended or adjusted under 35 U.S.C. 154(b) by 217 days.

(21) Appl. No.: 17/596,709

(22) PCT Filed: Jun. 17, 2020

(86) PCT No.: PCT/EP2020/066723
§ 371 (c)(1),
(2) Date: Dec. 16, 2021

(87) PCT Pub. No.: WO2020/254382
PCT Pub. Date: Dec. 24, 2020

(65) Prior Publication Data
US 2022/0317168 A1 Oct. 6, 2022

(30) Foreign Application Priority Data
Jun. 18, 2019 (EP) ..................................... 19180877

(51) Int. Cl.
*H02S 50/00* (2014.01)
*H04B 3/46* (2015.01)
(Continued)

(52) U.S. Cl.
CPC .............. *H02S 50/00* (2013.01); *G01R 27/02* (2013.01); *H02J 3/381* (2013.01); *H04B 3/46* (2013.01);
(Continued)

(58) Field of Classification Search
CPC ... G01R 27/02; H02J 3/381; H02J 3/46; H02J 3/56; H02J 23/24; H02S 50/00
See application file for complete search history.

(56) References Cited

U.S. PATENT DOCUMENTS 9,831,916 B2    11/2017  Behrends
2011/0121652 A1*  5/2011  Sella ........................ H02J 1/10
                                                                              307/43

(Continued)

FOREIGN PATENT DOCUMENTS

CN        102869997 A      1/2013
CN        104243721 A     12/2014
(Continued)

OTHER PUBLICATIONS

International Search Report corresponding to PCT Application No. PCT/EP2020/066723, dated Aug. 10, 2020 (German and English language document) (3 pages).

*Primary Examiner* — Paresh Patel
(74) *Attorney, Agent, or Firm* — Maginot, Moore & Beck LLP

(57) ABSTRACT

A photovoltaic, PV, module level monitoring system (1) comprising a photovoltaic array (PVA) including at least one photovoltaic string (PVS) comprising photovoltaic modules, PVM, (5) each having a module level device, MLD, (4) adapted to monitor and/or to control the associated photovoltaic module, PVM, (5), wherein each module level device, MLD, (4) comprises a transceiver adapted to communicate with a transceiver of a base station (2) of an inverter (6) connected to said photovoltaic array (PVA), (Continued)

wherein the transceivers are coupled by associated duplexer circuits (7) to a DC power network comprising power cables (3) connecting the photovoltaic modules, PVM, (5) of the at least one photovoltaic string (PVS) of said photovoltaic array (PVA) with the base station (2) of the inverter (6), wherein a signal amplitude of a communication signal, CS, transmitted by a transceiver via its associated duplexer circuit (7) is adjusted automatically depending on a monitored impedance, $Z_{PV}$, of the respective photovoltaic array (PVA).

11 Claims, 8 Drawing Sheets

(51) Int. Cl.
*H04B 3/56* (2006.01)
*H04B 17/318* (2015.01)
*G01R 27/02* (2006.01)
*H02J 3/38* (2006.01)

(52) U.S. Cl.
CPC ............. *H04B 3/56* (2013.01); *H04B 17/318* (2015.01); *H02J 2300/24* (2020.01)

(56) References Cited

U.S. PATENT DOCUMENTS

| | | |
|---|---|---|
| 2016/0087679 A1 | 3/2016 | Behrends |
| 2018/0026448 A1* | 1/2018 | Falk .................. H02M 7/54 307/7 |
| 2021/0234507 A1* | 7/2021 | Pozsgay .................. H04B 3/46 |

FOREIGN PATENT DOCUMENTS

| | | |
|---|---|---|
| CN | 109565179 A | 4/2019 |
| DE | 199 40 544 A1 | 3/2001 |
| EP | 2 725 678 A1 | 4/2014 |
| FR | 2 870 061 A1 | 11/2005 |

* cited by examiner

METHOD FOR COMMUNICATION BETWEEN TRANSCEIVERS OF MODULE LEVEL DEVICES WITHIN A PHOTOVALTAIC MODULE LEVEL MONITORING SYSTEM

PRIORITY CLAIM

This application is a 35 U.S.C. 371 National Stage application of PCT/EP2020/066723, filed Jun. 17, 2020, which claims priority to European Application No. 19180877.3 filed on Jun. 18, 2019. The entire contents of the above-mentioned patent applications are incorporated herein by reference as part of the disclosure of this U.S. application.

TECHNICAL FIELD

The invention relates to a method for communication between transceivers of module level devices adapted to monitor and/or to control associated photovoltaic modules of a photovoltaic array.

TECHNICAL BACKGROUND

A photovoltaic system can comprise one or more photovoltaic strings of photovoltaic modules within a photovoltaic array. The photovoltaic array having one or more photovoltaic strings can be connected via a DC line to an inverter adapted to convert a DC current received from the photovoltaic array into an AC current supplied to a distribution network. In photovoltaic systems, powerline communication PLC can be used. The powerline communication PLC has been chosen recently by the SunSpec Consortium to generate keepalive signals to control a Rapid Shutdown RSD of a photovoltaic array at photovoltaic module level as requested by NEC2017. The employed modulation scheme defined by SunSpec for the Rapid Shutdown RSD is based on an S-FSK modulation over the DC powerline connecting the photovoltaic modules of the photovoltaic system.

Crosstalk is an unwanted mutual influence of independent signal channels which can occur in the photovoltaic system. Crosstalk makes it difficult to distinguish between different signal sources. A communication signal can couple onto multiple other signal lines. If a signal strength is high and packages are sent on both lines at the same time, then a packet can be corrupted and may not be properly demodulated at the receiver. The electromagnetic compatibility standards enforced in several countries require the electromagnetic radiation to be always below a maximum threshold. The radiation in this frequency range can be estimated by the signal-current which is coupled onto the DC-wire loop of the PV-system and this current is depending on the impedance value of a photovoltaic panel or photovoltaic array which can change strongly with the received solar radiation of the photovoltaic modules of the photovoltaic array. Consequently, there are changes in the impedance value of the photovoltaic array based on the fluctuation of the received solar radiation.

Accordingly, there is a need to provide a reliable communication method for communication between transceivers of module level devices of a photovoltaic array which is widely independent from possible fluctuations of the environment of the photovoltaic array, in particular independent from fluctuations of the solar radiation and a need to monitor precisely a momentary photovoltaic impedance of a photovoltaic array.

SUMMARY OF THE INVENTION

The invention provides according to the first aspect a method for communication between transceivers of module level devices provided to monitor and/or to control associated photovoltaic modules and a transceiver of a base station of an inverter,
wherein the transceivers are coupled by associated duplexer circuits to a DC power network comprising power cables connecting the photovoltaic modules of at least one photovoltaic string of a photovoltaic array with said inverter,
wherein a signal amplitude of a communication signal transmitted by a transceiver via its associated duplexer circuit is adjusted automatically depending on a monitored impedance of said photovoltaic array.

In a possible embodiment of the method according to the first aspect of the present invention, the monitored impedance of the photovoltaic array changes its impedance value based on a fluctuation of solar radiation received by the photovoltaic modules of the respective photovoltaic array.

In a further possible embodiment of the method according to the first aspect of the present invention, the impedance of the photovoltaic array comprising one or more photovoltaic strings is determined depending on a measured communication signal or depending on a test signal received by a transceiver of a base station of the inverter via its associated duplexer circuit and depending on a reference signal.

In a further possible embodiment of the method according to the first aspect of the present invention, the reference signal comprises a calibrated communication signal with a predetermined amplitude transmitted by the transceiver of the base station of the inverter via its associated duplexer circuit.

In a further possible embodiment of the method according to the first aspect of the present invention, the impedance value of the photovoltaic array is calculated depending on a turn ratio and a coupling coefficient of a transformer of the duplexer circuit coupling the transceiver to the DC power network connecting the photovoltaic modules of the respective photovoltaic string of said photovoltaic array and depending on a resistance of a voltage divider resistor connected to a primary side of the transformer in response to the measured received communication or test signal and the reference signal.

In a further possible embodiment of the method according to the first aspect of the present invention, the signal amplitude of the communication signal transmitted by a transceiver during operation of the photovoltaic array is adjusted automatically depending on the calculated impedance value of the photovoltaic array such that the amplitude of the communication signal is below a predetermined threshold value.

In a further possible embodiment of the method according to the first aspect of the present invention, the threshold value is configured to achieve an electromagnetic interference compatibility of the communication via the DC power network.

In a further possible embodiment of the method according to the first aspect of the present invention, the impedance of the photovoltaic array is determined periodically and/or in response to a detected event.

The invention provides according to the second aspect a photovoltaic module level monitoring system comprising a photovoltaic array including at least one photovoltaic string comprising photovoltaic modules each having a module level device adapted to monitor and/or to control the associated photovoltaic module, wherein each module level device comprises a transceiver adapted to communicate with a transceiver of a base station of an inverter connected to said photovoltaic array, wherein the transceivers are coupled by associated duplexer circuits to a DC power network comprising power cables connecting the photovoltaic modules of the at least one photovoltaic string of said photovoltaic array with the base station of the inverter, wherein a signal amplitude of a communication signal transmitted by a transceiver via its associated duplexer circuit is adjusted automatically depending on a monitored impedance of the respective photovoltaic array.

In a possible embodiment of the photovoltaic module level monitoring system according to the second aspect of the present invention, each transceiver comprises a signal transmitter adapted to transmit communication signals via the associated duplexer circuit and the power cables of the DC power network of the photovoltaic string and a signal receiver adapted to receive communication signals via the associated duplexer circuit from power cables of the DC power network of the photovoltaic string.

In a further possible embodiment of the photovoltaic module level monitoring system according to the second aspect of the present invention, the duplexer circuit of a transceiver comprises a transformer having a primary coil connected to the transceiver and a secondary coil connected to the photovoltaic string.

In a further possible embodiment of the photovoltaic module level monitoring system according to the second aspect of the present invention, the duplexer circuit of the transceiver comprises a voltage divider resistor connected in series to the primary coil of the transformer of the duplexer circuit of said transceiver to provide a reception voltage applied to the signal receiver of said transceiver.

In a further possible embodiment of the photovoltaic module level monitoring system according to the second aspect of the present invention, the primary coil of the transformer of the duplexer circuit is coupled by means of a capacitor to the signal transmitter of the transceiver to transmit a transmission voltage from the signal transceiver.

In a further possible embodiment of the photovoltaic module level monitoring system according to the second aspect of the present invention, each transceiver is connected to a processor of the module level device to adjust a transmission voltage of the signal transmitter according to a signal to be transmitted and to evaluate a reception voltage of a signal received by the signal receiver.

In a further possible embodiment of the photovoltaic module level monitoring system according to the second aspect of the present invention, the processor of the module level device is adapted to adjust a signal amplitude of a communication signal transmitted by the signal transmitter of the transceiver automatically depending on a monitored impedance of the respective photovoltaic array evaluated by said processor in response to a communication signal or in response to a test signal received by the signal receiver of the transceiver.

In a further possible embodiment of the photovoltaic module level monitoring system according to the second aspect of the present invention, the impedance value of the photovoltaic array is calculated by the processor depending on a turn ratio and a coupling coefficient of the transformer of the duplexer circuit coupling the transceiver to the DC power network connecting the photovoltaic modules in the respective photovoltaic string of said photovoltaic array with the inverter and depending on a resistance of the voltage divider resistor connected to the primary side of said transformer in response to the measured received communication signal and a reference signal.

In a further possible embodiment of the photovoltaic module level monitoring system according to the second aspect of the present invention, each module level device is adapted to monitor physical parameters of at least one associated photovoltaic module including an electrical current, a voltage, a temperature and/or an energy produced by said photovoltaic module.

The invention further provides according to a third aspect a method for monitoring a photovoltaic impedance of a photovoltaic array comprising at least one photovoltaic string having photovoltaic modules each having a module level device used to monitor and/or to control the associated photovoltaic module, wherein each module level device comprises a transceiver coupled by an associated duplexer circuit to a DC power network comprising power cables connecting the photovoltaic modules of the photovoltaic string with an inverter of said photovoltaic array, wherein the photovoltaic impedance of the photovoltaic array is determined depending on a turn ratio and a coupling coefficient of a transformer of the duplexer circuit and depending on a resistance of a voltage divider resistor connected to a primary side of said transformer in response to a measured received signal and a reference signal.

BRIEF DESCRIPTION OF FIGURES

In the following, possible embodiments of the different aspects of the present invention are described in more detail with reference to the enclosed figures.

DETAILED DESCRIPTION OF EMBODIMENT

Figure 1:
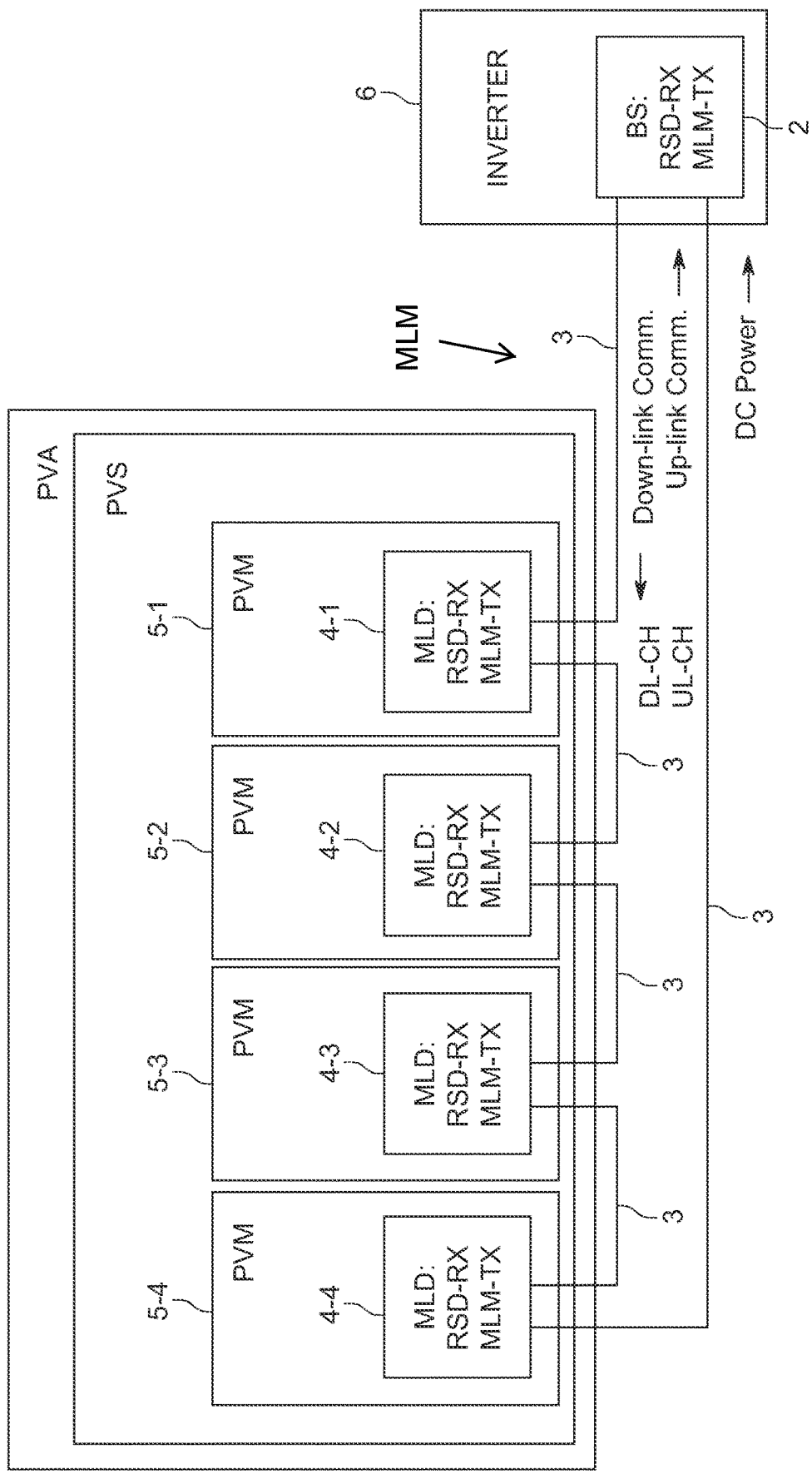
FIG. 1 shows a block diagram for illustrating a possible exemplary embodiment of a photovoltaic module level monitoring system according to an aspect of the present invention.
Figure 2:
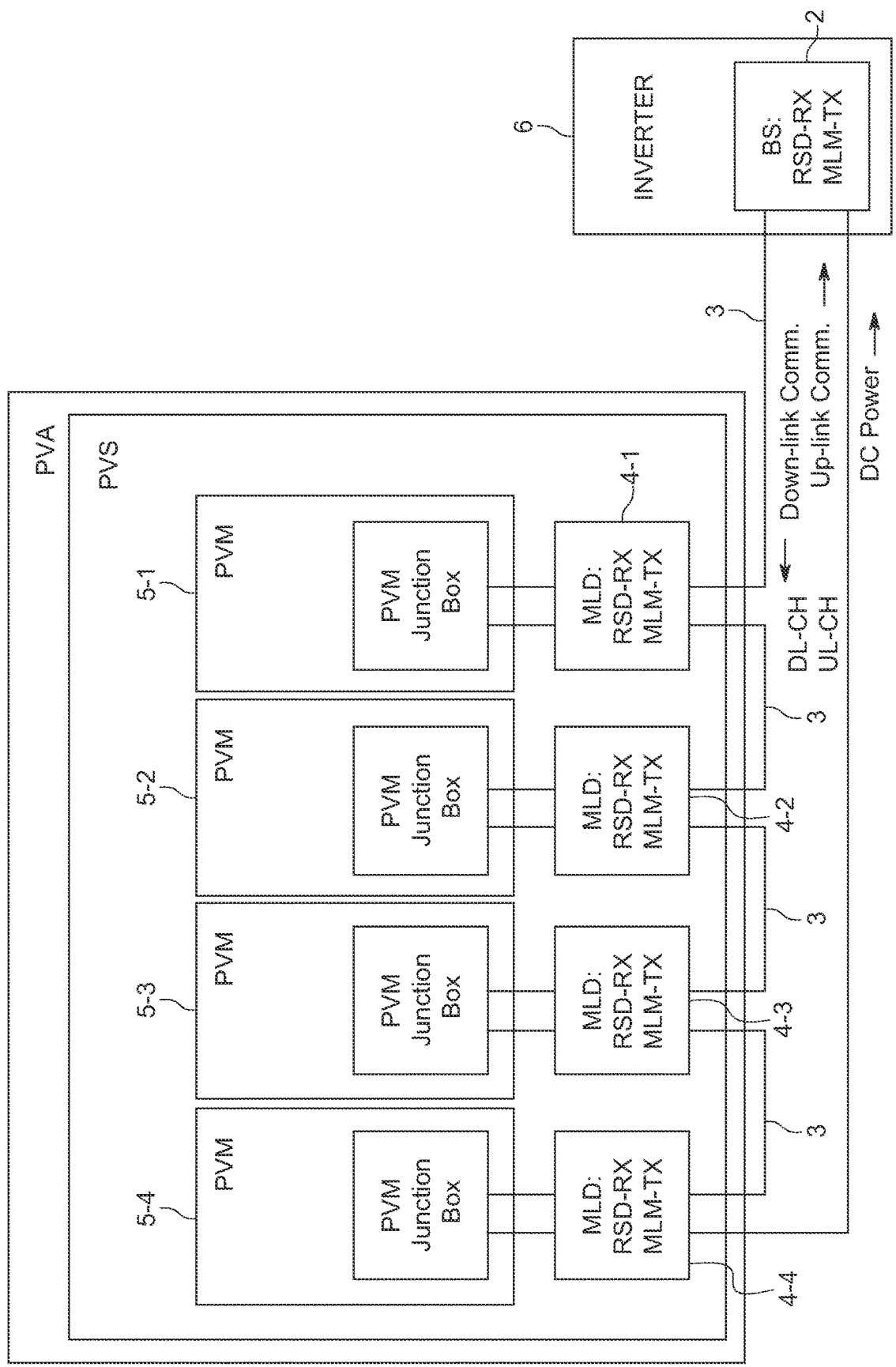
FIG. 2 shows another possible exemplary embodiment of a photovoltaic module level monitoring system according to an aspect of the present invention with module level devices placed in add-on boxes.
Figure 3:
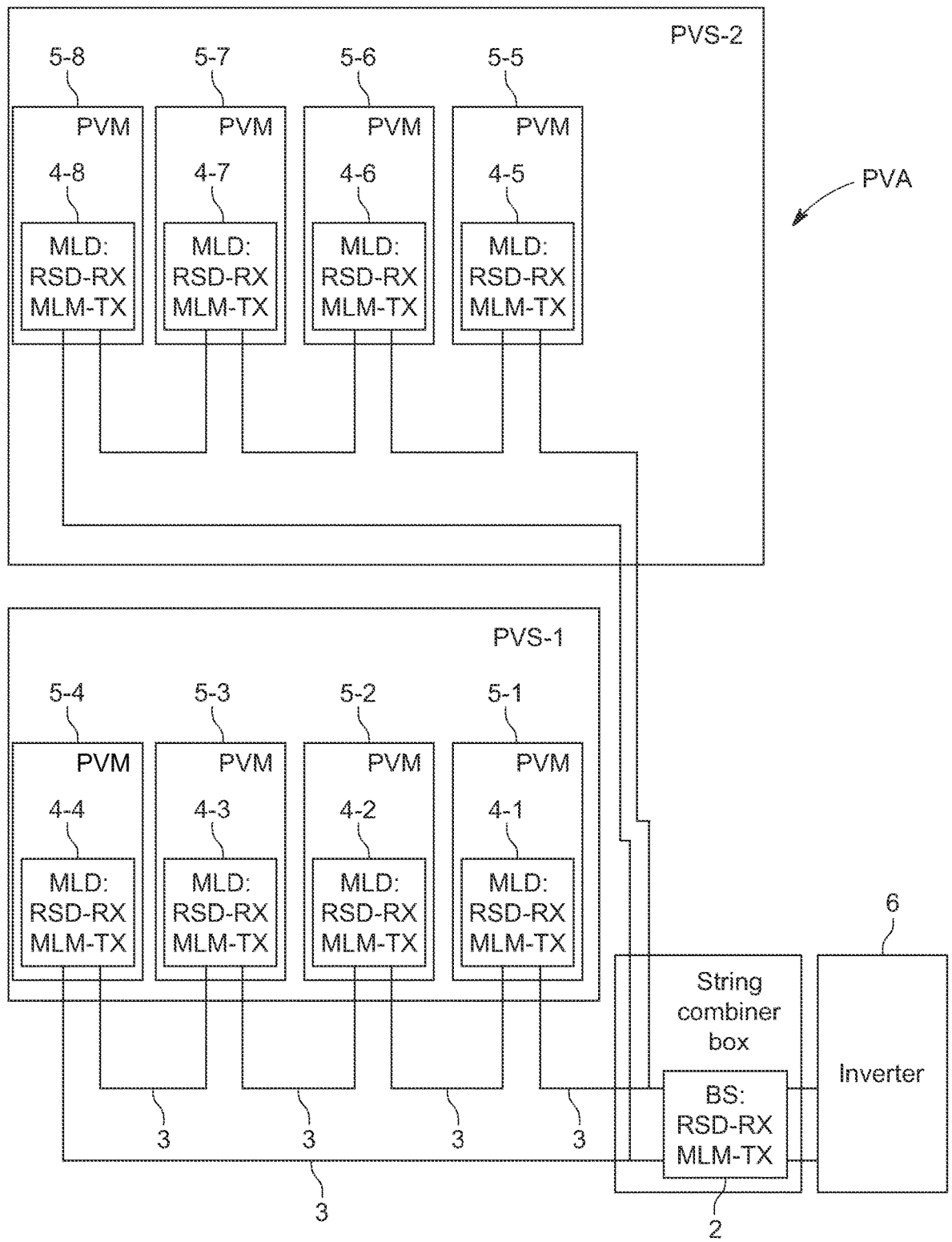
FIG. 3 shows a block diagram of another possible exemplary embodiment of a photovoltaic module level monitoring system according to an aspect of the present invention with a base station placed in an external box.

FIGS. 1, 2, 3 show different exemplary embodiments of a photovoltaic module level monitoring system 1 according to an aspect of the present invention. As can be seen in FIG. 1, the photovoltaic module level monitoring system 1 can comprise a base station 2 connected by means of power cables 3 to module level devices (MLD) 4. The module level devices 4 are provided to monitor and/or to control associated photovoltaic modules 5 as also illustrated in FIG. 1. The number of module level devices 4 coupled to a DC power network can vary depending on the use case. In the illustrated embodiment of FIG. 1, four module level devices 4-1, 4-2, 4-3, 4-4 are placed into PV module junction boxes and are coupled to the DC power network or DC power loop comprising the base station 2. Each module level device, MLD, 4 comprises in a possible embodiment a module level monitoring, MLM, transmitter, MLM-TX, and a Rapid Shutdown, RSD, receiver, RSD-RX. The base station 2, BS, comprises in a possible embodiment, a transmitter, MLM-TX, and a Rapid Shutdown, RSD, receiver, RSD-RX.

FIG. 2 shows another possible embodiment of a photovoltaic module level monitoring (MLM) system 1 where module level devices (MLD) 4 are placed into separate add-on boxes. In the illustrated embodiments of FIGS. 1, 2, the base station (BS) 2 is integrated in an inverter 6. The base station 2 can be connected by means of power cables 3 to different module level devices 4 coupled to the DC power network. The module level devices 4 are provided to monitor and/or to control the associated photovoltaic modules (PVM) 5. The base station 2 comprises a base station transmitter MLM-TX and a base station receiver RSD-RX. The base station transmitter MLM-TX of the base station 2 can be adapted to transmit rapid shutdown RSD control signals in predefined time slots in a downlink channel DL-CH via the power cables 3 to the module level devices 4. The base station receiver RSD-RX of the base station 2 can be adapted to receive monitoring signals MS generated by the module level devices 4 through the power cables 3 within time slots via an uplink channel UL-CH assigned to the module level devices MLDs, 4.

In the illustrated embodiments of FIGS. 1, 2, the base station 2 forms part of a photovoltaic inverter 6. In an alternative embodiment, the base station 2 can also form part of an add-on box of a separate device, for example in a string combiner box as also illustrated in FIG. 3.

In the embodiments illustrated in FIGS. 1, 2, the photovoltaic array PVA comprises a single photovoltaic string PVS having four photovoltaic modules 5-1 to 5-4. In the embodiment illustrated in FIG. 3, the photovoltaic array PVA comprises more than one photovoltaic string, i.e. a first photovoltaic string PVS-1 and a second photovoltaic string PVS-2. The first photovoltaic string PVS-1 comprises four photovoltaic modules 5-1 to 5-4 and the second photovoltaic string PVS-2 comprises four photovoltaic modules 5-5 to 5-8. Accordingly, in the illustrated embodiment of FIG. 3, the photovoltaic array PVA comprises two parallel connected photovoltaic strings PVS each comprising a predetermined number of n=4 photovoltaic modules 5-$i$.

Each photovoltaic module 5-$z$ of the photovoltaic module level monitoring system 1 as illustrated in the embodiments of FIGS. 1, 2, 3 comprises an associated module level device 4 having a transceiver used for communication. A transceiver MLM-TX, RSD-RX of a module level device MLD 4 can communicate with a transceiver MLM-TX, RSD-RX of the base station 2 of the inverter 6 by means of the power cables 3.

Figure 4:
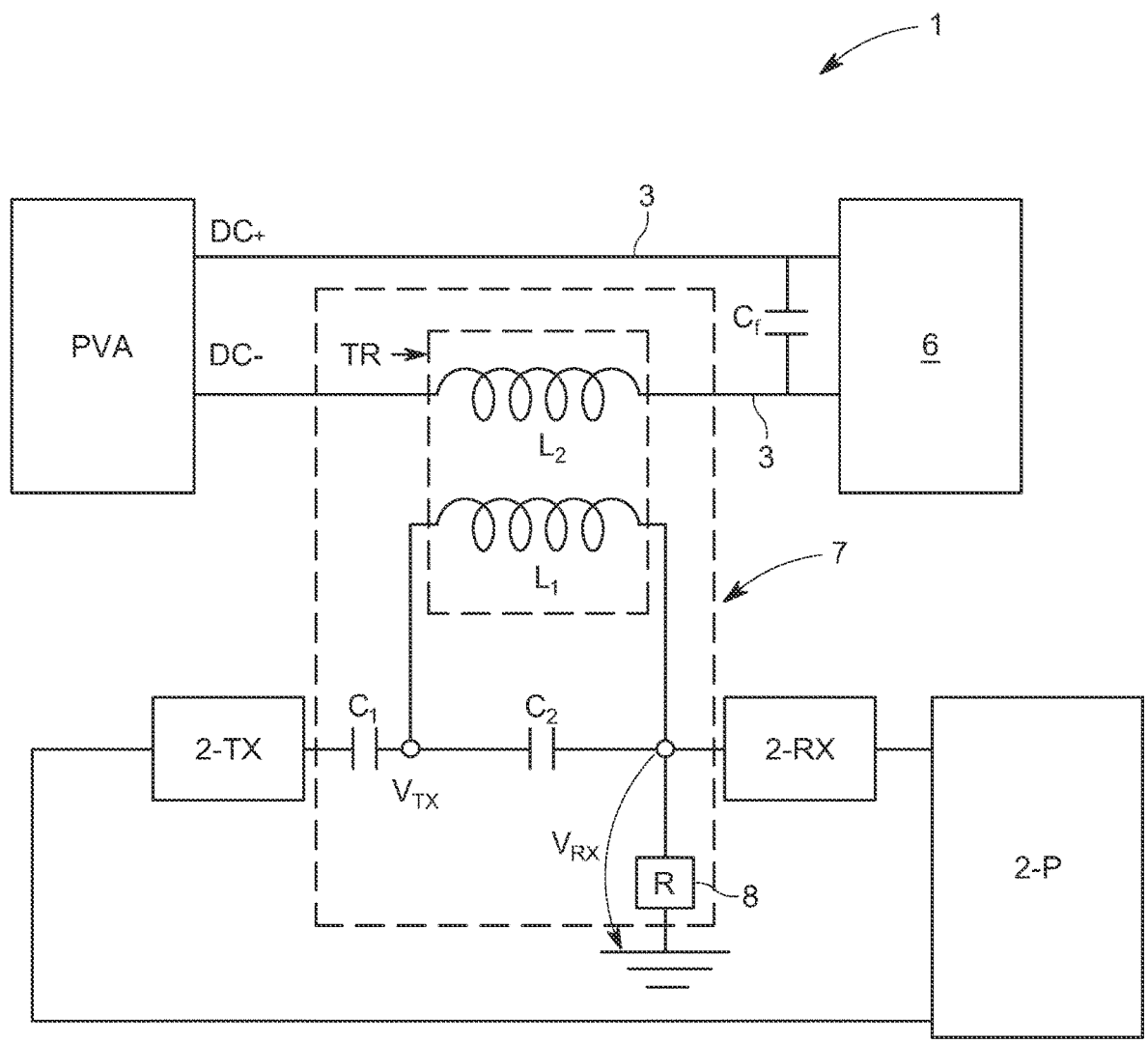
FIG. 4 shows a diagram for illustrating a possible exemplary embodiment of a method and apparatus used for communication between transceivers within a photovoltaic module level monitoring system according to the present invention.

FIG. 4 shows a diagram for illustrating a possible exemplary embodiment of a method and apparatus used for communication between transceivers within a photovoltaic module level monitoring system 1 according to the present invention. The transceivers are coupled by associated duplexer circuits 7 as illustrated also in FIG. 4 to a DC power network comprising the power cables 3 connecting the photovoltaic modules 5 of the photovoltaic strings PVS within the photovoltaic array PVA with the inverter 6.

In the illustrated embodiment of the photovoltaic module level monitoring system 1 as shown in FIGS. 1, 2, 3, each transceiver of a MLD 4 and the transceiver of the base station 2 can comprise a signal transmitter TX adapted to transmit communication signals CS via its associated duplexer circuit 7 and the power cables 3 of the DC power network of the photovoltaic string PVS. Further, each transceiver can comprise a signal receiver RX adapted to receive communication signals CS via its associated duplexer circuit 7 from power cables 3 of the DC power network of the photovoltaic string PVS. The associated duplexer circuit 7 as in FIG. 4 is not explicitly shown in the FIGS. 1, 2, 3.

FIG. 4 shows the duplexer circuit 7 of the base station 2 connecting the signal transmitter 2-TX and the signal receiver 2-RX of the base station 2 with the photovoltaic array PVA. In a possible embodiment, the duplexer circuit 7 of a transceiver comprises a transformer TR having a primary coil L1 connected to the transceiver and a secondary coil L2 connected to the photovoltaic string PVS.

In a preferred embodiment, the duplexer circuit 7 of the transceiver comprises a voltage divider resistor 8 connected in series to the primary coil L1 of the transformer TR of the duplexer circuit 7 of the transceiver to provide a reception voltage $V_{RX}$ applied to the signal receiver RX of the respective transceiver as also shown in FIGS. 4, 5.

The primary coil L1 of the transformer TR of the duplexer circuit 7 can be coupled by means of a capacitor C1 to the signal transmitter TX of the respective transceiver to transmit a transmission voltage $V_{TX}$. In a possible embodiment, the transceiver 2-TX, 2-RX is connected to a processor 2-P of the base station 2 to adjust a transmission voltage $V_{TX}$ of the signal transmitter 2-TX according to a signal to be transmitted and to evaluate a reception voltage $V_{RX}$ of a signal received by the respective signal receiver 2-RX.

The processor 2-P of the base station 2 is adapted to adjust a signal amplitude of a communication signal CS transmitted by the signal transmitter 2-TX of the transceiver automatically depending on a monitored impedance $Z_{PV}$ of the respective photovoltaic array PVA evaluated by the processor 2-P in response to a communication signal CS or in response to a test signal received by the signal receiver 2-RX of the respective transceiver.

The impedance value $Z_{PV}$ of the photovoltaic array PVA is calculated by the processor 2-P depending on a turn ratio N and a coupling coefficient K of the transformer TR of the duplexer circuit 7 coupling the transceiver of the base station 2 to the DC power network which connects the photovoltaic modules 5 in the respective photovoltaic string PVS of the photovoltaic array PVA with the inverter 6 and depending on a resistance R of the voltage divider resistor 8 connected to the primary side L1 of the transformer TR in response to the measured received communication signal CS and a reference signal RefSig.

According to the method of the present invention, a signal amplitude of a communication signal transmitted by a transceiver via its associated duplexer circuit 7 is adjusted automatically depending on a monitored impedance $Z_{PV}$ of the photovoltaic array PVA. The monitored impedance $Z_{PV}$ of the photovoltaic array PVA of the photovoltaic module level monitoring system 1 does change its value based on a fluctuation of solar radiation received by the photovoltaic modules 5 of the photovoltaic array PVA.

In a possible embodiment, the impedance $Z_{PV}$ of the photovoltaic array PVA is determined depending on a measured communication signal received by a transceiver of the inverter 6 via its associated duplexer circuit 7 and depending on a reference signal. In an alternative embodiment, the impedance $Z_{PV}$ of the photovoltaic array PVA can be determined depending not on a measured communication signal but depending on a predefined test signal received by a transceiver of the inverter 6 via its associated duplexer circuit 7 and depending on a reference signal RefSig. The reference signal RefSig can comprise in a possible embodiment a calibrated communication signal with a predetermined amplitude transmitted by the transceiver of the inverter 6 via its associated duplexer circuit 7.

The impedance value $Z_{PV}$ of the photovoltaic array PVA can be calculated in a possible embodiment depending on a turn ratio and a coupling coefficient of a transformer TR of the duplexer circuit 7 coupling the transceiver to the DC power network connecting the photovoltaic modules PVM 5 in the respective photovoltaic string PVS of the photovoltaic array PVA and depending on a resistance of a voltage divider resistor connected to a primary side of the transformer TR in response to the measured received communication or test signal and reference signal. The signal amplitude of a communication signal CS transmitted by a transceiver during operation of the photovoltaic array PVA can be adjusted automatically depending on the calculated impedance value $Z_{PV}$ of the photovoltaic array PVA such that the amplitude of the communication signal is below a predetermined threshold value.

In a possible embodiment, the threshold value can be configured to achieve an electromagnetic interference compatibility of the communication via the DC power network. In a possible embodiment, the impedance value $Z_{PV}$ of the photovoltaic array PVA is determined periodically. In an alternative embodiment, the impedance value $Z_{PV}$ of the photovoltaic array PVA can also be determined in response to a detected event occurring in the photovoltaic module level monitoring system 1 or in its environment.

Each module level device MLD 4 is adapted to monitor physical parameters of the associated photovoltaic module PVM 5. These physical parameters can include an electrical current, a voltage, a temperature and/or an energy produced by the photovoltaic module PVM 5. These parameters can be notified to a control unit and/or to the base station 2 in communication signals CS.

With the communication method according to the first aspect of the present invention, the signal amplitude of the communication signal CS is adjusted automatically depending on a monitored impedance $Z_{PV}$ of the photovoltaic array PVA.

The invention provides according to a further aspect a method for monitoring a photovoltaic impedance $Z_{PV}$ of the photovoltaic array PVA. The photovoltaic impedance $Z_{PV}$ of said photovoltaic array PVA is determined in this monitoring method depending on a turn ratio N and a coupling coefficient K of the transformer TR of the duplexer circuit 7 and depending on a resistance R of a voltage divider resistor 8 connected to the primary side L1 of the transformer TR in response to a measured received signal and a reference signal RefSig.

With the communication method according to the first aspect of the present invention, a current value of the communication signal CS can be maintained not to exceed a maximum threshold by indirectly measuring an impedance value $Z_{PV}$ of the photovoltaic installation and by automatically adjusting a voltage value of the communication signal CS based on the variations in the impedance value $Z_{PV}$ on the primary side of the transformer TR.

The communication method can be performed at the side of the base station 2. Further, the communication method can optionally also be performed at the side of the MLD 4 of each PVM 5.

FIG. 4 shows a circuit diagram for illustrating a possible exemplary embodiment of an apparatus and method according to the present invention. In the photovoltaic module level monitoring, MLM, system 1, the transmitter 2-TX and the receiver 2-RX of a base station 2 and the transceivers of the module level devices 4 with one or more photovoltaic strings PVS are connected to each other through power cables 3 of the DC power network and are coupled to the DC network by means of associated duplexer circuits 7 as also illustrated in FIG. 4. In the illustrated schematic diagram of FIG. 4, the photovoltaic string PVS of a photovoltaic array PVA is connected via a power cable 3 to a transformer TR forming part of a duplexer circuit 7 connecting the base station 2 at the inverter 6 to the DC power network. In the illustrated embodiment of FIG. 4, the transformer TR has a primary coil L1 and a secondary coil L2. Further, the inverter 6 can be connected to the DC power network by means of a bypass filter $C_F$ as shown in FIG. 4.

The impedance value $Z_{PV}$ of the photovoltaic array PVA comprising the at least one photovoltaic string PVS can change its value based on a fluctuation of solar radiation received by the photovoltaic modules 5 of the photovoltaic array PVA. The momentary impedance $Z_{PV}$ of the photovoltaic array PVA is determined automatically depending on a measured communication signal CS or a test signal received by the receiver 2-RX within the base station 2 of the inverter 6 via the associated duplexer circuit 7 comprising the transformer TR and depending on a reference signal RefSig. This reference signal RefSig can comprise a calibrated communication signal CScal with a predetermined amplitude transmitted by a transmitter 2-TX of the transceiver within the base station 2 of the inverter 6 via the associated duplexer circuit 7 including the transformer TR. In a possible embodiment, both the signal transmitter 2-TX and the signal receiver 2-RX can be connected to a processor 2-P of the base station 2 as shown in FIG. 4.

The momentary impedance value $Z_{PV}$ of the photovoltaic array PVA having at least one photovoltaic string PVS can be calculated by the processor 2-P depending on the turn ratio N and a coupling coefficient K of the transformer TR of the duplexer circuit 7 coupling the transceiver of the base station 2 to the DC power network and depending on a resistance R of a voltage divider resistor 8 in response to the measured received communication signal CS or received test signal and the reference signal RefSig. The voltage divider resistor 8 with resistance R is connected to the primary side L1 of the transformer TR as shown in FIG. 4. The transceiver of the base station 2 comprises a signal transmitter 2-TX and a signal receiver 2-RX as shown in FIG. 4. The signal transmitter 2-TX is adapted to transmit communication signals CS via the associated duplexer circuit 7 and the power cables 3 of the DC power network of the photovoltaic string PVS. The signal receiver 2-RX is adapted to receive communication signals CS via the associated duplexer circuit 7 from power cables 3 of the DC power network of the photovoltaic string PVS.

The duplexer circuit 7 connected to the signal transmitter 2-TX and the signal receiver 2-RX comprises the transformer TR having a primary coil L1 and a secondary coil L2 connected to the photovoltaic string PVS. The signal transmitter 2-TX of the transceiver of the base station 2 generates a communication signal CS having an output voltage $V_{TX}$ which can be coupled via a capacitor C1 to the primary coil L1 of the transformer TR as shown in FIG. 4. Further, the signal receiver 2-RX of the base station 2 of the inverter 6 receives a voltage $V_{RX}$ along the voltage divider resistor 8 as shown in FIG. 4.

The signal transmitter 2-TX and the signal receiver 2-RX can inform the processor 2-P about the output voltage $V_{TX}$ of the transmission signal and the voltage $V_{RX}$ of the reception signal. In a configuration memory, a turn ratio N and/or a coupling coefficient K of the transformer TR of the duplexer circuit 7 can be stored.

The processor 2-P, in particular a microprocessor, of the base station 2 can calculate depending on the turn ratio N and the coupling coefficient K of the transformer TR of the duplexer circuit 7 and depending on the resistance R of the voltage divider resistor 8 connected to the primary side L1 of the transformer TR the impedance value $Z_{PV}$ of the photovoltaic array PVA in response to the measured received communication signal voltage $V_{RX}$ and a reference signal RefSig. In a possible embodiment, the impedance $Z_{PV}$ of the photovoltaic array PVA is calculated by the processor 2-P periodically.

After having determined the momentary impedance value $Z_{PV}$ of the photovoltaic array PVA, a signal amplitude of the communication signal CS transmitted by the signal transmitter 2-TX of the transceiver during operation of the photovoltaic array PVA is adjusted automatically depending on the calculated impedance value $Z_{PV}$ of the photovoltaic array PVA. In a preferred embodiment, the signal amplitude of the communication signal CS transmitted by the signal transmitter 2-TX of the transceiver is adjusted automatically depending on the determined impedance value $Z_{PV}$ of the photovoltaic array PVA such that the amplitude of the communication signal CS is below a predetermined threshold value. The threshold value can be configured such that electromagnetic interference compatibility of the communication via the DC power network is achieved. Also advantageously, the signal-level reduction due to the present invention also leads to a considerable reduction in crosstalk which can occur in the photovoltaic system.

With the system 1 according to the present invention, a photovoltaic impedance $Z_{PV}$ of a photovoltaic array PVA can be monitored continuously. This can be achieved by receiving a reception signal $V_{RX}$ from the photovoltaic string PVS by the signal receiver 2-RX of the transceiver of the base station 2. Then, the impedance value $Z_{PV}$ of the photovoltaic array PVA can be determined based on $Z_{PV-transformed}$, the resistance R of the voltage divider resistor 8, the voltage of the transmitted signal $V_{TX}$, the voltage of the received signal $V_{RX}$ and the turn ratio N of the transformer TR by applying a voltage divider rule. The transmission signal $V_{TX}$ can be calibrated in a possible embodiment to a predefined value and may be used as a reference signal RefSig. In a further step, a calibrated impedance value can be obtained by measuring the reception voltage $V_{RX}$ in response to the predefined value of the transmission voltage $V_{TX}$. The processor 2-P can then calculate the complex impedance value $Z_{PV}$ of the photovoltaic array PVA. The impedance value $Z_{PV}$ of the photovoltaic installation can be determined from the received signal at the side of the inverter 6. This can also be referred to as a galvanic isolated impedance measurement. A transceiver of the base station 2 of the inverter 6 not only transmits a signal but also receives a signal from the photovoltaic system 1.

The impedance value of the photovoltaic installation can be transformed based on the turn ratio N of the transformer TR. This does form a voltage divider in conjunction with the resistance R of the voltage divider resistor 8.

In a simple case (neglecting any phase information), the voltage divider can be used to derive the photovoltaic impedance $R_{PV}$.

$$R_{PV} = \frac{R \cdot V_{TX} - R \cdot V_{RX}}{N \cdot V_{RX}},$$

wherein R is the resistance of the voltage divider resistor 8 defining a transmitter impedance of the communication unit transceiver, $V_{TX}$ is the output voltage of the signal transmitter TX of the transceiver, $V_{RX}$ is the received input voltage of the signal receiver RX of the transceiver and N is the turn ratio of the transformer TR.

The momentary values of the transmission voltage $V_{TX}$, of the reception voltage $V_{RX}$ can be captured at the voltage divider circuit.

Further, a calibration factor K can be determined by a controller or processor 2-P of the base station 2 to which the $V_{TX}$ values can be matched to $Z_{PV}$ values.

The inverter 6 comprises a base station 2 with a transceiver having a signal receiver 2-RX adapted to receive signals from the transceivers of the module level devices 4 of the photovoltaic modules PVM 5.

The impedance $Z_{PV}$ of the photovoltaic array PVA can be transformed into a transformed impedance $Z_{PV-transformed}$ based on the turn ratio (N1/N2) of the transformer TR within the duplexer circuit 7 as also illustrated schematically in FIG. 5.

$$Z_{PV-transformed} = Z_{PV} \cdot \left(\frac{N1}{N2}\right)^2 \cdot K,$$

wherein K is a coupling coefficient of the transformer TR having a turn ratio.

Figure 5A:
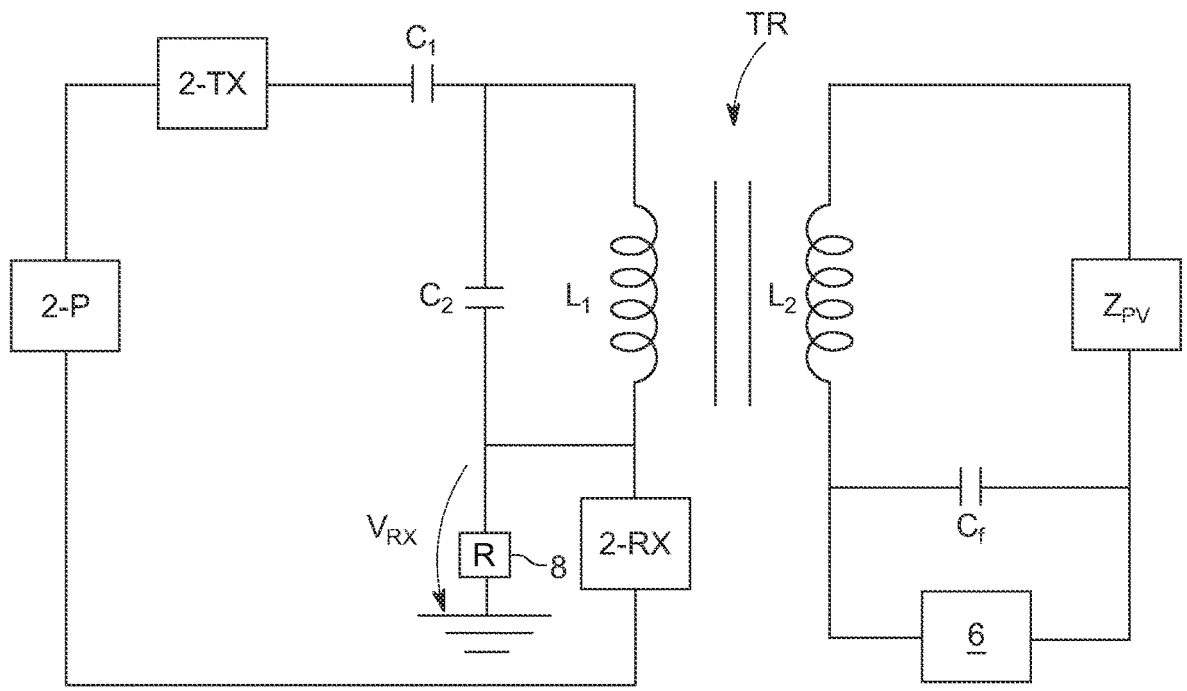
FIG. 5 shows a further schematic diagram for illustrating the operation of the method and apparatus for communication between transceivers of module level devices of a photovoltaic module level monitoring system according to the present invention.
Figure 5B:
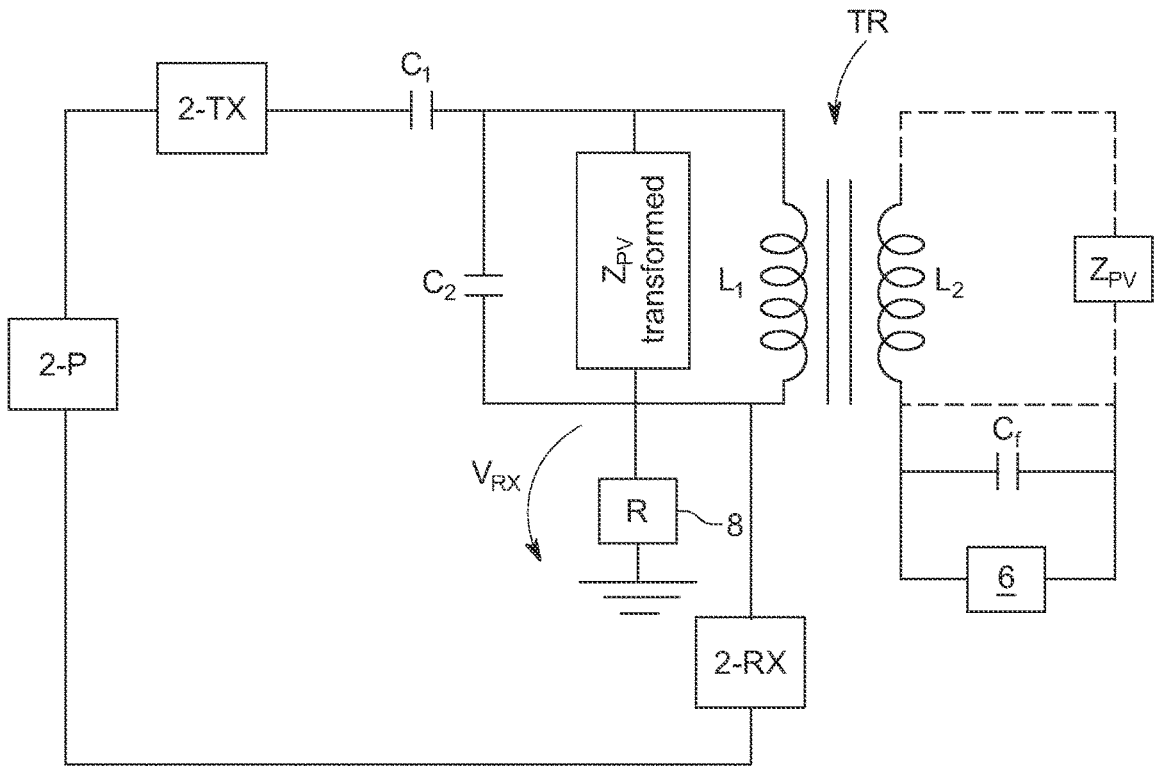

As can be seen in FIGS. 5A, 5B, the transformed impedance $Z_{PV-transformed}$ and the resistor 8 form a voltage divider circuit. The resistance R of the resistor 8 can be defined in a possible embodiment by a standard, for example, by the SunSpec standard.

$$Z_{PV-transformed} = R\left(\frac{V_{TX}}{V_{RX}} - 1\right),$$

$$Z_{PV} = \frac{1}{K}\left(\frac{N2}{N1}\right)^2 \cdot R\left(\frac{V_{TX}}{V_{RX}} - 1\right),$$

wherein N2/N1 is the inverse turn ratio N of the transformer TR and

R is the resistance of the resistor 8 of the voltage divider circuit,

K is the coupling coefficient of the transformer TR, $V_{TX}$ is the transmission voltage of the transceiver and $V_{RX}$ is the reception voltage of the transceiver.

FIG. 5B shows an equivalent circuit to the circuit illustrated in FIG. 5A.

In a possible embodiment, the transmission voltage $V_{TX}$ of the transceiver, i.e. the transmission voltage of the signal transmitter 2-TX of the transceiver, can be calibrated to get a defined output voltage at the PV port (i.e. factory value). Since the impedance used for this calibration is known, this does allow for calibration of the impedance measurement. The accuracy of the measurement is influenced from the sent to received signal level ratio during calibration.

Since it is possible to determine the time relationship between the sent and received signal, this information can be used to determine a complex impedance value $Z_{PV}$. In a possible embodiment, this can be achieved by looking for first zero crossings in both signals $V_{TX}$, $V_{RX}$ and calculating a time difference in terms of samples. In another possible embodiment, both signals can be correlated with each other. In a further possible embodiment, Fast Fourier Transformation FFT can be used to determine the complex impedance value $Z_{PV}$. The phase information of the phase between the transmission voltage $V_{TX}$ and the reception voltage $V_{RX}$ can be further processed to derive additional knowledge about the current state of the photovoltaic array PVA.

Figure 6:
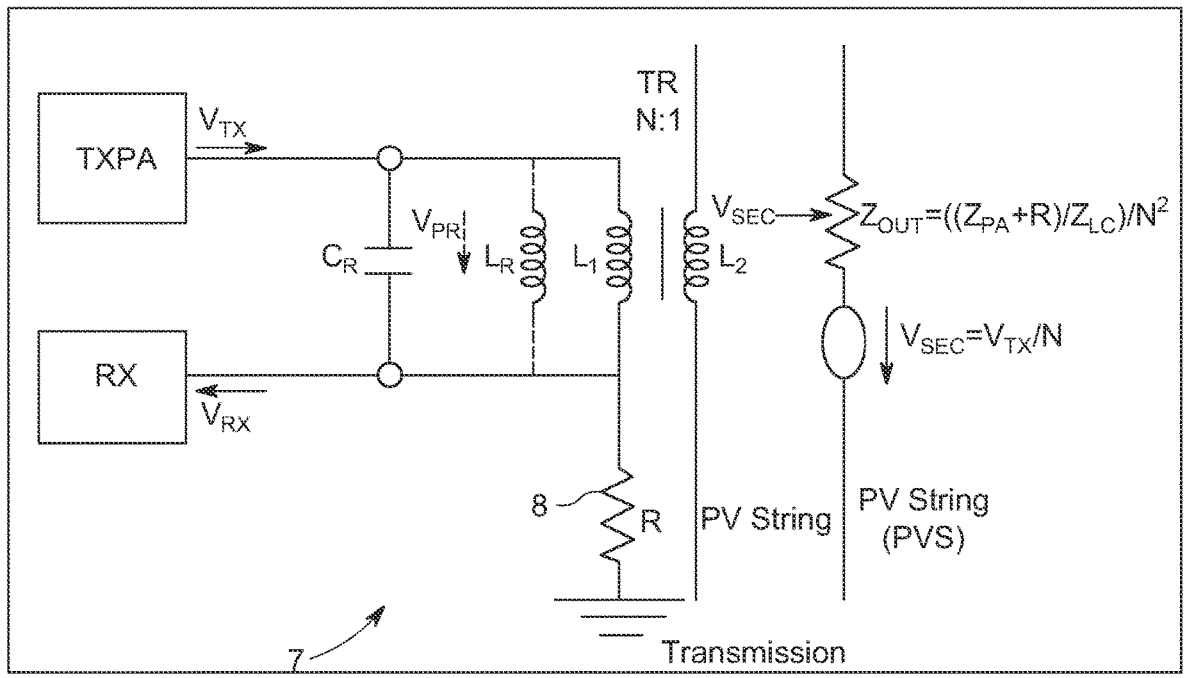
FIG. 6 shows a circuit diagram for illustrating a possible coupling of a DC power network of a photovoltaic module level monitoring system according to the present invention.

FIG. 6 shows a circuit diagram for illustrating a possible coupling of a DC power network according to a further possible exemplary embodiment of a photovoltaic module level monitoring system 1 according to the present invention. In the illustrated exemplary embodiment of FIG. 6, the duplexer circuit 7 comprises a resonator circuit including a capacitor $C_R$ connected in parallel to the primary winding L1 of the high-current transformer TR having a magnetizing inductance $L_R$. The capacitor $C_R$ form the resonator circuit with the inductance $L_R$ around the RX and TX FSK frequencies. Here, those skilled in the art will appreciate that other signals/modulations may be used and modulation is not limited to FSK. The resistor 8 connected to the resonator circuit provides the input node for the RX channel, i.e. for the signal receiver RX of the transceiver.

For transmission, a transmission power amplifier TXPA can generate a RF signal that is injected via the high-current transformer TR into the PVM string as a serial voltage $V_{TX}$. The secondary voltage $V_{SEC}$ induced in the secondary winding L2 of the high-current transformer TR is determined by the output voltage of the power amplifier TXPA and the transformer winding ratio N. If the output impedance of the power amplifier TXPA is generally much lower than the resistance R of the resistor 8, the output impedance $Z_{out}$ is mainly defined by the resistance R of the resistor 8 divided by $N^2$. If the resonator circuit is designed to have an impedance well above the resistance R of the resistor 8, the amplitude of the transmission signal injected into the RX channel is mainly determined by the string impedance $Z_{STR}$ of the photovoltaic string PVS:

$$V_{RX}=V_{TX}\cdot R/(R+Z_{PA}+N*Z_{STR})$$

For example, with N=2, $Z_{PV}$=20 Ohm, R=4 Ohm, the voltage $V_{RX}$ is $V_{TX}$·0.09, i.e. there is approx 21 dB attenuation between the TX output and the RX input at the resonance frequency fR of the resonator circuit. The output impedance $Z_{PA}$ of the power amplifier TXPA is considered to be 0.2. The string impedance $Z_{STR}$ of the photovoltaic string PVS is equal to the impedance $Z_{PV}$ of the photovoltaic array PVA.

Figure 7:
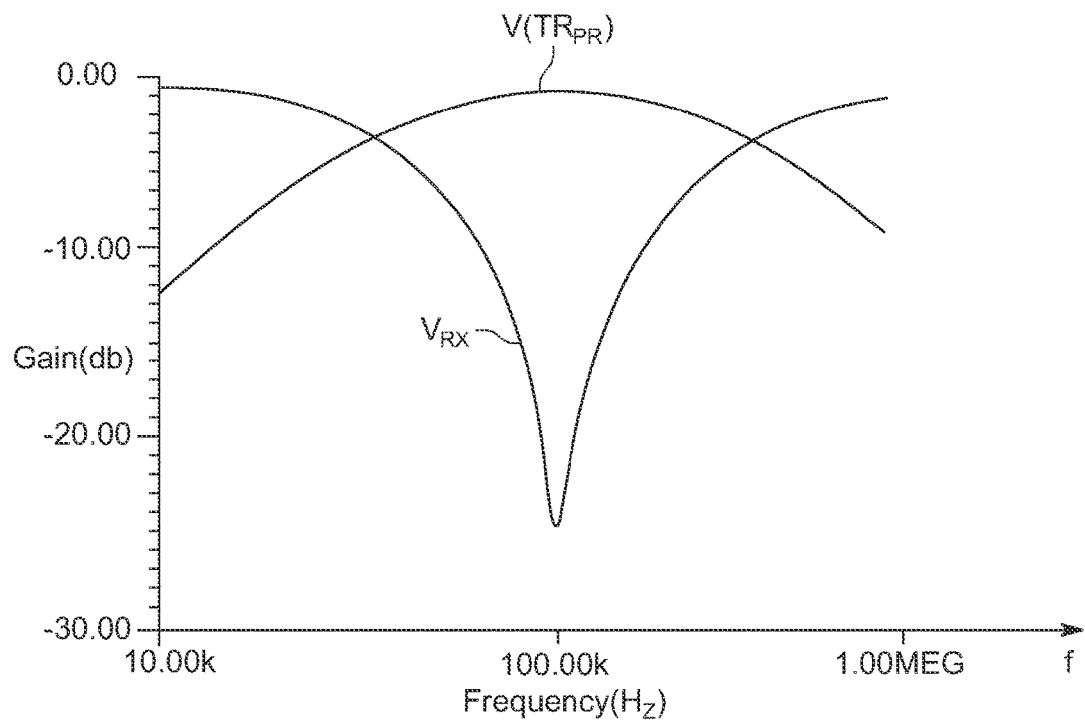
FIG. 7 shows a diagram for illustrating AC simulation results for the coupling illustrated in FIG. 6.

FIG. 7 shows a signal diagram to illustrate AC simulation results for a coupling duplexer circuit 7. As can be seen, the TX attenuation is less than 0.5 dB in the RSD FSK frequency bands (131 to 144 kHz). Further, it can be seen that the RX attenuation is better than 20 dB in the same frequency band.

During reception, the signal received from the photovoltaic string PVS passes through the high-current transformer TR to the resonance or resonator circuit. Since the output impedance $Z_{PA}$ of the power amplifier TXPA is lower than the resistance R of the resistor 8, the voltage $V_{RX}$ is roughly identical to the secondary side of the transformer TR, i.e. the RX signal loss is negligible. This is also illustrated in FIG. 8.

Figure 8:
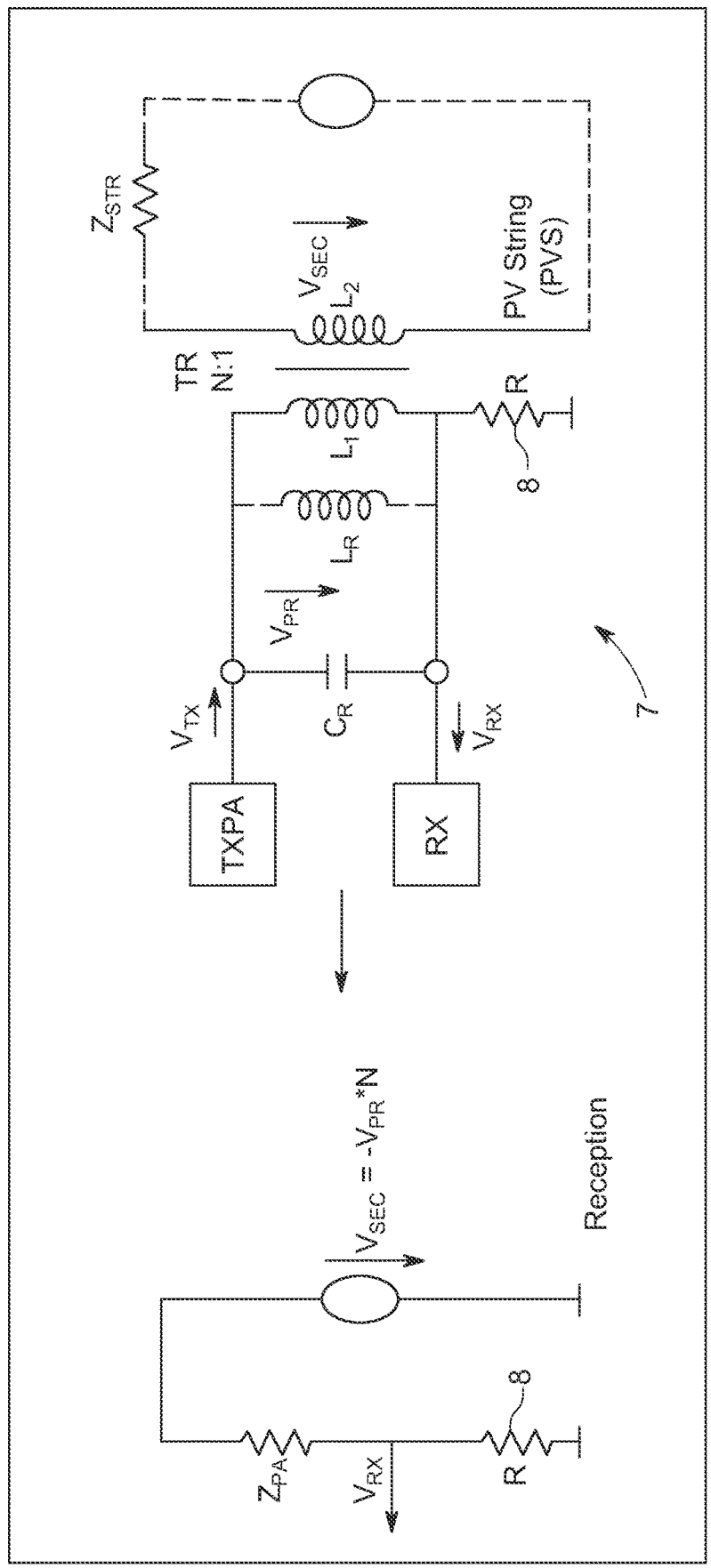
FIG. 8 shows a further circuit diagram for illustrating a further possible exemplary embodiment of a coupling of a DC power network in a photovoltaic module level monitoring system according to the present invention.
Figure 9:
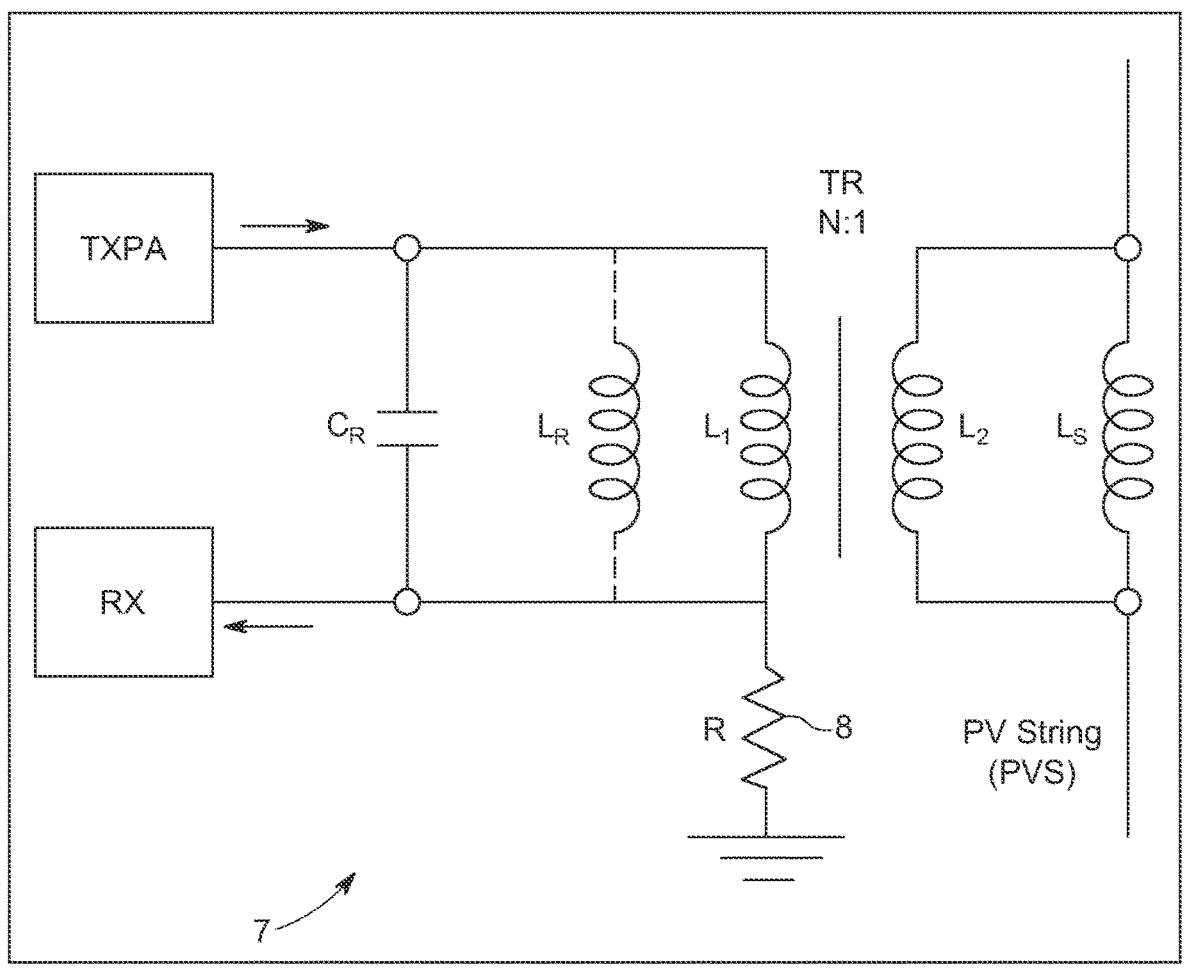
FIG. 9 shows a further circuit diagram for illustrating a possible exemplary embodiment of a coupling to a DC power network of a photovoltaic module level monitoring system according to the present invention.

In an alternative embodiment, the high-current transformer TR as illustrated in the embodiments of FIGS. 6, 8, can be replaced by a high-current inductance $L_S$ and a small signal transformer TR as also illustrated in the circuit diagram of FIG. 9.

The invention claimed is:

1. A method for communication between transceivers of module level devices provided to monitor and/or to control associated photovoltaic modules and a transceiver of an inverter,
   wherein the transceivers are coupled by associated duplexer circuits to a DC power network comprising power cables connecting the photovoltaic modules of at least one photovoltaic string of a photovoltaic array with said inverter,
   wherein a signal amplitude of a communication signal transmitted by a transceiver via its associated duplexer circuit is adjusted automatically depending on a monitored impedance of said photovoltaic array,
   wherein the impedance of the photovoltaic array is determined depending on a measured communication signal or a test signal received by a transceiver of a base station of the inverter via its associated duplexer circuit and depending on a reference signal,
   wherein the reference signal comprises a calibrated communication signal with a predetermined amplitude transmitted by the transceiver of the base station of the inverter via its associated duplexer circuit,
   wherein the impedance value of the photovoltaic array is calculated depending on a turn ratio and a coupling coefficient of a transformer of the duplexer circuit coupling the transceiver of the base station of the inverter to the DC power network connecting the photovoltaic modules in the respective photovoltaic string of the photovoltaic array and depending on a resistance of a voltage divider resistor connected to a primary side of said transformer, in response to the measured received communication or test signal and the reference signal, and
   wherein the signal amplitude of the communication signal, transmitted by a transmitter of the transceiver of the base station during operation of the photovoltaic array is adjusted automatically depending on the calculated impedance value of the photovoltaic array such that the amplitude of the communication signal is below a predetermined threshold value.

2. The method according to claim 1 wherein the monitored impedance of the photovoltaic array changes its value based on a fluctuation of solar radiation received by the photovoltaic modules of the respective photovoltaic array.

3. The method according to claim 1 wherein the impedance of the photovoltaic array is determined periodically and/or in response to a detected event.

4. The method according to claim 1 wherein each transceiver is connected to a processor to adjust a transmission voltage of the signal transmitter according to a signal to be transmitted and to evaluate a reception voltage of a signal received by the signal receiver.

5. The method according to claim 4 wherein the processor of the base station is adapted to adjust a signal amplitude of a communication signal transmitted by the signal transmitter of the transceiver of the base station automatically depending on a monitored impedance of the respective photovoltaic array evaluated by said processor in response to a communication signal or in response to a test signal received by the signal receiver of the transceiver of the base station.

6. The method according to claim 5 wherein the impedance value of the photovoltaic array is calculated by said processor depending on the turn ratio and the coupling coefficient of the transformer of the duplexer circuit coupling the transceiver of the base station to the DC power network connecting the photovoltaic modules in the respective photovoltaic string of said photovoltaic array with the inverter and depending on the resistance of the voltage divider resistor connected to the primary side of said transformer in response to the measured received communication signal or test signal and the reference signal.

7. A photovoltaic module level monitoring system comprising:
  a photovoltaic array including at least one photovoltaic string PV comprising photovoltaic modules each having a module level device, MLD adapted to monitor and/or to control the associated photovoltaic module,
  wherein each module level device comprises a transceiver adapted to communicate with a transceiver of a base station of an inverter connected to said photovoltaic array, wherein the transceivers are coupled by associated duplexer circuits to a DC power network comprising power cables connecting the photovoltaic modules of the at least one photovoltaic string of said photovoltaic array with the base station of the inverter,
  wherein a signal amplitude of a communication signal transmitted by a transceiver via its associated duplexer circuit is adjusted automatically depending on a monitored impedance of the respective photovoltaic array,
  wherein the impedance of the photovoltaic array is determined depending on a measured communication signal or a test signal received by the transceiver of the base station of the inverter via its associated duplexer circuit and depending on a reference signal,
  wherein the reference signal comprises a calibrated communication signal with a predetermined amplitude transmitted by the transceiver of the base station of the inverter via its associated duplexer circuit,
  wherein the impedance value of the photovoltaic array is calculated depending on a turn ratio and a coupling coefficient of a transformer of the duplexer circuit coupling the transceiver of the base station of the inverter (6) to the DC power network connecting the photovoltaic modules in the respective photovoltaic string of the photovoltaic array and depending on a resistance of a voltage divider resistor connected to a primary side of said transformer, in response to the measured received communication or test signal and the reference signal, and
  wherein the signal amplitude of the communication signal, transmitted by a transmitter of the transceiver of the base station during operation of the photovoltaic array is adjusted automatically depending on the calculated impedance value of the photovoltaic array such that the amplitude of the communication signal is below a predetermined threshold value.

8. The photovoltaic module level monitoring system according to claim 7 wherein each transceiver comprises:
  a signal transmitter adapted to transmit communication signals via the associated duplexer circuit and the power cables of the DC power network of the photovoltaic string and
  a signal receiver adapted to receive communication signals via the associated duplexer circuit from power cables of the DC power network of the photovoltaic string.

9. The photovoltaic module level monitoring system according to claim 7 wherein the duplexer circuit of the transceiver of the base station comprises the voltage divider resistor connected in series to the primary coil of the transformer of the duplexer circuit of said transceiver of the base station to provide a reception voltage applied to the signal receiver of said transceiver of the base station.

10. The photovoltaic module level monitoring system according to claim 9 wherein the primary coil of the transformer of the duplexer circuit is coupled by means of a capacitor to the signal transmitter of the transceiver of the base station to transmit a transmission voltage from the signal transmitter.

11. The photovoltaic module level monitoring system according to claim 7 wherein each module level device is adapted to monitor physical parameters of at least one associated photovoltaic module including a current, a voltage, a temperature and/or an energy produced by said photovoltaic module.

* * * * *